United States Patent
Sugiya et al.

(10) Patent No.: US 10,707,129 B2
(45) Date of Patent: Jul. 7, 2020

(54) PROCESSING METHOD OF WAFER

(71) Applicant: DISCO CORPORATION, Tokyo (JP)

(72) Inventors: Tetsukazu Sugiya, Tokyo (JP); Heidi Lan, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/887,560

(22) Filed: Feb. 2, 2018

(65) Prior Publication Data
US 2018/0226295 A1   Aug. 9, 2018

(30) Foreign Application Priority Data

Feb. 3, 2017 (JP) .................................. 2017-018341

(51) Int. Cl.
*H01L 21/268* (2006.01)
*H01L 21/301* (2006.01)
(Continued)

(52) U.S. Cl.
CPC ............ *H01L 21/78* (2013.01); *H01L 21/268* (2013.01); *H01L 21/3043* (2013.01);
(Continued)

(58) Field of Classification Search
CPC ............ H01L 21/6836; H01L 21/6838; H01L 21/3043; H01L 21/268; H01L 21/67092;
(Continued)

(56) References Cited

U.S. PATENT DOCUMENTS 6,455,920 B2 * 9/2002 Fukasawa ............... H01L 21/56
257/618
7,064,010 B2 * 6/2006 Farnworth .............. H01L 21/78
257/E21.502
(Continued)

FOREIGN PATENT DOCUMENTS

JP   11-251493   * 9/1999   ............. H01L 21/78
JP   2000-182995 A   6/2000
(Continued)

OTHER PUBLICATIONS

Translation of JP 2005-166936 from Japan Platform for Patent Information, Jul. 19, 2019.*
(Continued)

*Primary Examiner* — Mary A Wilczewski
(74) *Attorney, Agent, or Firm* — Greer Burns & Crain, Ltd.

(57) ABSTRACT

A processing method of a wafer includes a cut groove forming step of carrying out cutting with a cutting blade along streets from the back surface of the wafer to form cut grooves, a wafer dividing step of irradiating the wafer with a laser beam along the cut grooves and dividing the wafer into individual chips after the cut groove forming step is carried out, and a die bonding layer disposing step of applying a liquid die bonding agent on the back surface of the wafer and curing it to form the chips on which die bonding layers are formed on the back surface. According to the processing method of the present invention, the occur-
(Continued)

rence of clogging in the cutting blade and generation of a burr or the like in the die bonding layers can be prevented.

4 Claims, 4 Drawing Sheets

(51) Int. Cl.
    *H01L 21/304* (2006.01)
    *H01L 21/78* (2006.01)
    *H01L 21/67* (2006.01)
    *H01L 21/683* (2006.01)

(52) U.S. Cl.
    CPC .. *H01L 21/67092* (2013.01); *H01L 21/67115* (2013.01); *H01L 21/6836* (2013.01); *H01L 21/6838* (2013.01); *H01L 2221/6834* (2013.01); *H01L 2221/68327* (2013.01)

(58) Field of Classification Search
    CPC ... H01L 2221/68327; H01L 21/78–786; H01L 21/7806; H01L 21/782; H01L 21/784
    See application file for complete search history.

(56) References Cited

U.S. PATENT DOCUMENTS

| | | | | |
|---|---|---|---|---|
| 7,112,874 | B2* | 9/2006 | Atlas | H01L 21/78 257/678 |
| 7,179,723 | B2* | 2/2007 | Genda | B23K 26/18 257/E21.599 |
| 7,763,528 | B2* | 7/2010 | Kushima | H01L 21/78 257/E21.599 |
| 7,767,551 | B2* | 8/2010 | Arita | H01L 21/78 438/460 |
| 8,975,163 | B1* | 3/2015 | Lei | H01L 21/78 257/E21.602 |
| 9,293,372 | B2* | 3/2016 | Nagaoka | H01L 21/6835 |
| 9,536,787 | B2* | 1/2017 | Ogawa | H01L 21/78 |
| 9,700,961 | B2* | 7/2017 | Kitahara | H01L 21/78 |
| 9,716,040 | B2* | 7/2017 | Haimoto | H01L 21/78 |
| 10,049,934 | B2* | 8/2018 | Yamashita | H01L 21/2686 |
| 10,366,925 | B2* | 7/2019 | Sugiya | H01L 21/304 |
| 2001/0041387 | A1* | 11/2001 | Tateiwa | B28D 5/022 438/114 |
| 2004/0113283 | A1* | 6/2004 | Farnworth | H01L 21/3043 257/782 |
| 2005/0064683 | A1* | 3/2005 | Farnworth | H01L 21/304 438/464 |
| 2005/0082651 | A1* | 4/2005 | Farnworth | H01L 21/78 257/678 |
| 2005/0186760 | A1* | 8/2005 | Hashimura | B23K 26/18 438/460 |
| 2006/0154447 | A1* | 7/2006 | Kushima | H01L 21/78 438/460 |
| 2006/0223284 | A1* | 10/2006 | Li | H01L 21/6835 438/463 |
| 2006/0244132 | A1* | 11/2006 | Kang | H01L 21/6836 257/724 |
| 2007/0105345 | A1* | 5/2007 | Kurosawa | H01L 21/78 438/460 |
| 2007/0190688 | A1* | 8/2007 | Youn | H01L 21/568 438/108 |
| 2007/0190749 | A1* | 8/2007 | Yoshikawa | H01L 21/78 438/460 |
| 2008/0047408 | A1* | 2/2008 | Oba | H01L 21/78 83/39 |
| 2008/0251188 | A1* | 10/2008 | Sekiya | B28D 5/0082 156/153 |
| 2009/0004780 | A1* | 1/2009 | Arita | H01L 21/78 438/114 |
| 2009/0079038 | A1* | 3/2009 | Schneegans | H01L 21/78 257/620 |
| 2009/0124063 | A1* | 5/2009 | Nakamura | B23K 26/009 438/463 |
| 2009/0189258 | A1* | 7/2009 | Mariani | H01L 21/78 257/632 |
| 2009/0197351 | A1* | 8/2009 | Morikazu | B23K 26/03 438/5 |
| 2009/0215245 | A1* | 8/2009 | Nakamura | B23K 26/032 438/463 |
| 2009/0280622 | A1* | 11/2009 | Genda | H01L 21/78 438/462 |
| 2010/0015784 | A1* | 1/2010 | Nakamura | B23K 26/009 438/464 |
| 2010/0227454 | A1* | 9/2010 | Dohmae | H01L 21/78 438/464 |
| 2011/0224344 | A1* | 9/2011 | Fujisawa | C08L 83/04 524/317 |
| 2011/0263097 | A1* | 10/2011 | Yoshimura | H01L 21/6836 438/463 |
| 2012/0061805 | A1* | 3/2012 | Amano | C09J 9/02 257/622 |
| 2012/0074565 | A1* | 3/2012 | Koroku | H01L 21/78 257/737 |
| 2012/0244682 | A1* | 9/2012 | Tanaka | B23K 26/0093 438/464 |
| 2013/0087948 | A1* | 4/2013 | Kitahara | B23K 26/18 264/400 |
| 2013/0087949 | A1* | 4/2013 | Kitahara | H01L 21/78 264/400 |
| 2014/0179083 | A1* | 6/2014 | Buenning | H01L 21/78 438/463 |
| 2014/0179084 | A1* | 6/2014 | Lei | H01L 21/78 438/463 |
| 2014/0315372 | A1* | 10/2014 | Nakamura | H01L 21/6836 438/462 |
| 2015/0024475 | A1* | 1/2015 | Duffin | G01N 33/54366 435/287.2 |
| 2015/0187650 | A1* | 7/2015 | Uchida | H01L 21/6835 438/463 |
| 2015/0243560 | A1* | 8/2015 | Yodo | H01L 21/6835 438/462 |
| 2015/0325480 | A1* | 11/2015 | Priewasser | H01L 21/78 438/465 |
| 2015/0371902 | A1* | 12/2015 | Sakai | H01L 21/78 257/620 |
| 2016/0027696 | A1* | 1/2016 | Nagaoka | H01L 21/6835 438/14 |
| 2016/0035635 | A1* | 2/2016 | Tanaka | H01L 22/20 438/7 |
| 2016/0270151 | A1* | 9/2016 | Morikazu | H01L 21/78 |
| 2016/0315011 | A1* | 10/2016 | Ogawa | H01L 21/78 |
| 2017/0053830 | A1* | 2/2017 | Haimoto | H01L 21/78 |
| 2017/0133269 | A1* | 5/2017 | Obata | H01L 23/3114 |
| 2017/0140989 | A1* | 5/2017 | Tabuchi | B05D 1/005 |
| 2017/0179076 | A1* | 6/2017 | Kamphuis | H01L 24/94 |
| 2017/0213774 | A1* | 7/2017 | Lu | H01L 21/68 |
| 2017/0221780 | A1* | 8/2017 | Tanaka | B23K 26/364 |
| 2018/0122700 | A1* | 5/2018 | Yamashita | H01L 21/2686 |
| 2018/0226295 | A1* | 8/2018 | Sugiya | H01L 21/67115 |
| 2019/0027408 | A1* | 1/2019 | Sugiya | H01L 21/304 |

FOREIGN PATENT DOCUMENTS

| | | | | |
|---|---|---|---|---|
| JP | 2005-019525 A | | 1/2005 | |
| JP | 2005-166936 | * | 6/2005 | ............ H01L 21/301 |
| JP | 2016-207936 | * | 12/2016 | ............ H01L 21/78 |
| JP | 2018-125479 | * | 8/2018 | ............ H01L 21/78 |
| JP | 2018-129361 | * | 8/2018 | ............ H01L 21/78 |
| JP | 2018-206795 | * | 12/2018 | ............ H01L 21/78 |
| JP | 2019-133997 | * | 9/2019 | ............ H01L 21/52 |

OTHER PUBLICATIONS

(56) References Cited

OTHER PUBLICATIONS

English Translation of JP 2016-207936; https://www.j-platpat.inpit.go.jp/p0200; Jan. 13, 2020. (Year: 2020).*

* cited by examiner

PROCESSING METHOD OF WAFER

BACKGROUND OF THE INVENTION

Field of the Invention

The present invention relates to a processing method of a wafer for dividing the wafer into individual chips.

Description of the Related Art

A wafer on which devices such as integrated circuits (ICs) and large-scale integrated circuits (LSIs) are marked out by planned dividing lines in a lattice manner and are formed on a surface thereof is divided into individual chips having the devices by dividing along the planned dividing lines. In order to mount the individually-divided chips on a metal frame or board (die bonding), chips on which an adhesive layer such as an adhesive film referred to as die attach film (DAF), for example, is formed have been widely employed.

In order to keep chips from being dispersed after a wafer is divided, for example, there is the following method. Specifically, a tape in which an adhesive layer like the above-described one is disposed is adhered to the back surface of the wafer in advance before the wafer is divided. Then, a cutting blade is made to cut into the wafer from the front surface of the wafer to reach the adhesive layer and the wafer is cut. Thereby, the wafer is divided into individual chips (for example, refer to Japanese Patent Laid-open No. 2000-182995). Furthermore, there is also the following method. Specifically, a wafer is divided into individual chips by grinding the wafer to reduce the thickness thereof and then an adhesive film is adhered to the back surface of the wafer. Thereafter, the adhesive layer is split by using ablation by applying a laser beam (for example, refer to Japanese Patent Laid-open No. 2005-019525).

SUMMARY OF THE INVENTION

However, in the above-described method of Japanese Patent Laid-open No. 2000-182995, there is a problem that clogging occurs in the cutting blade and a whisker-shaped burr is generated in the adhesive layer. Furthermore, in the above-described method of Japanese Patent Laid-open No. 2005-019525, so-called die shift, in which chips slightly move, occurs when the adhesive film is adhered to the wafer divided into the individual chips. Therefore, the cutting position needs to be detected on each street basis at the time of laser processing and the processing time is long with chips having a small size of 5 mm square or smaller, for example.

Thus, an object of the present invention is to provide a processing method of a wafer that prevents processing failure, prevents die shift and allows a wafer to be favorably divided into individual chips.

In accordance with an aspect of the present invention, there is provided a processing method of a wafer having a front surface on which a device is formed in each of regions marked out by a plurality of streets that intersect. The processing method includes a front surface protective member disposing step of disposing a front surface protective member on the front surface of the wafer, a holding step of holding the front surface side of the wafer on which the front surface protective member is disposed by a holding table, and a cut groove forming step of carrying out cutting with a cutting blade along the streets from a back surface of the wafer held by the holding table to form cut grooves. The processing method also includes a wafer dividing step of irradiating the wafer with a laser beam with such a wavelength as to be absorbed by the wafer along the cut grooves and dividing the wafer into individual chips after the cut groove forming step is carried out, and a die bonding layer disposing step of applying a liquid die bonding agent on the back surface of the wafer and curing the liquid die bonding agent applied on the back surface of the wafer to form the chips on which die bonding layers are disposed on the back surface before or after the wafer dividing step is carried out.

According to the processing method of a wafer in accordance with the present invention, even if the chip size of the singulated chips is as small as 5 mm square or smaller, for example, the occurrence of die shift can be prevented and the die bonding layers can be easily disposed. Furthermore, according to the present invention, the liquid die bonding agent is applied on the back surface and the die bonding layers are disposed at least after the cut grooves are formed in the wafer. Thus, the occurrence of clogging in the cutting blade and generation of a burr or the like in the die bonding layers can be prevented.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

Figure 1:
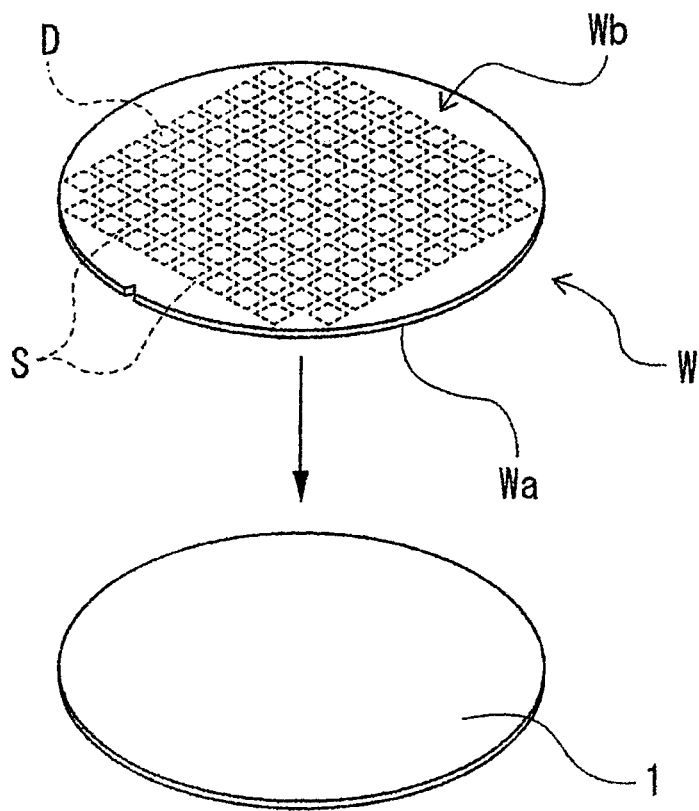
FIG. 1 is a perspective view showing a front surface protective member disposing step.

A wafer W shown in FIG. 1 is one example of a workpiece having a substrate with a circular plate shape and has a front surface Wa on which a device D is formed in each of the respective regions marked out by plural streets S formed in a lattice manner. A back surface Wb on the opposite side to the front surface Wa of the wafer W is a processing-target surface that is subjected to cutting processing by a cutting blade and is irradiated with a laser beam, for example. In the following, a processing method of a wafer for dividing the wafer W into individual chips will be described.

(1) Front Surface Protective Member Disposing Step

As shown in FIG. 1, a front surface protective member 1 is disposed on the front surface Wa of the wafer W. The front surface protective member 1 has at least a size with substantially the same diameter as the wafer W. When the whole of the front surface Wa of the wafer W is covered by the front surface protective member 1, each device D is protected. The material of the front surface protective member 1 is not particularly limited. For example, the front surface protective member 1 is formed of a hard plate of resin such as polyolefin or polyvinyl chloride, glass, silicon, or the like.

(2) Holding Step

Figure 2:
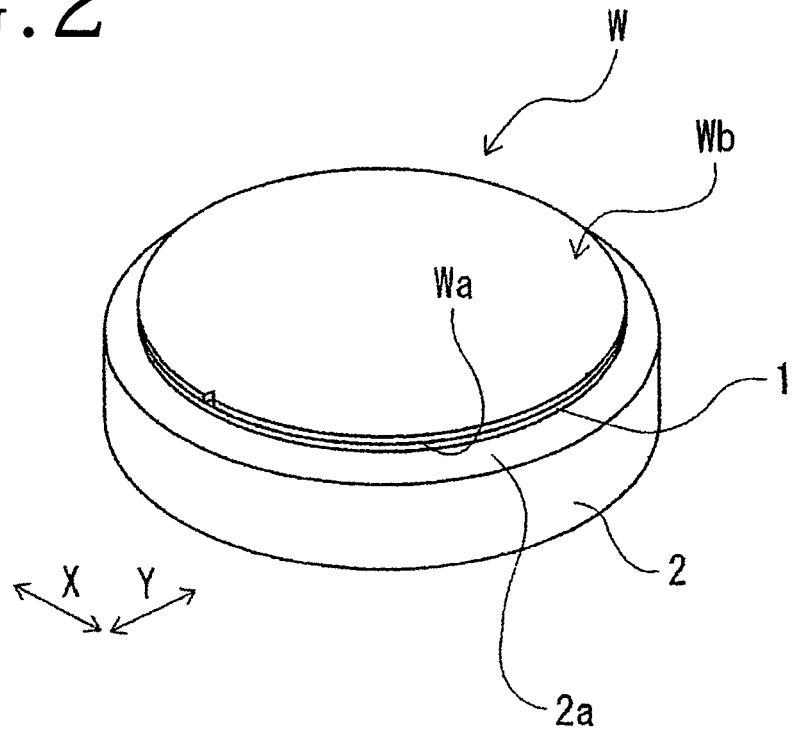
FIG. 2 is a perspective view showing a holding step.

As shown in FIG. 2, the wafer W on which the front surface protective member 1 is disposed is held by a holding table 2 that can rotate. The upper surface of the holding table 2 serves as a holding surface 2a that receives suction action from a suction source, which is not shown in the diagram, and holds the wafer W by suction. Although not shown in the diagram, movement means that moves the holding table 2 in a processing-feed direction (X-axis direction) is connected to the lower side of the holding table 2. On the holding table 2 configured in this manner, the side of the front surface Wa of the wafer W on which the front surface protective member 1 is disposed is held by suction by the holding surface 2a and the side of the back surface Wb of the wafer W is oriented upward.

(3) Cut Groove Forming Step

Figure 3A:
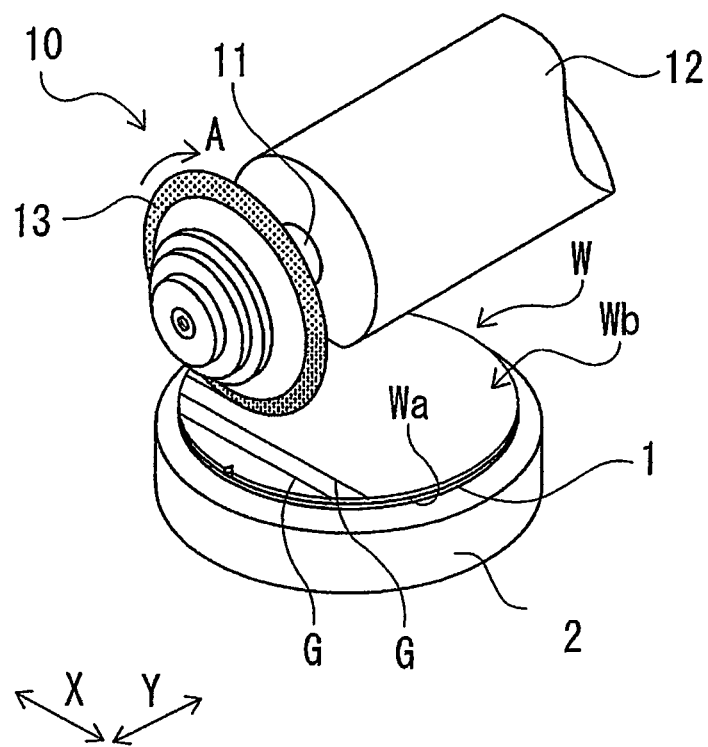
FIG. 3A is a perspective view showing a cut groove forming step.

Subsequently, as shown in FIG. 3A, cutting is carried out from the side of the back surface Wb of the wafer W by using cutting means 10 that cuts a workpiece. The cutting means 10 includes at least a spindle 11 having the axial center along a Y-axis direction, a spindle housing 12 that surrounds the spindle 11 rotatably, and a cutting blade 13 mounted to the tip of the spindle 11, and has a configuration in which the cutting blade 13 also rotates due to the rotation of the spindle 11. Although not shown in the diagram, movement means that moves the cutting means 10 in an indexing-feed direction (Y-axis direction) orthogonal to the processing-feed direction (X-axis direction) is connected to the cutting means 10.

Figure 3B:
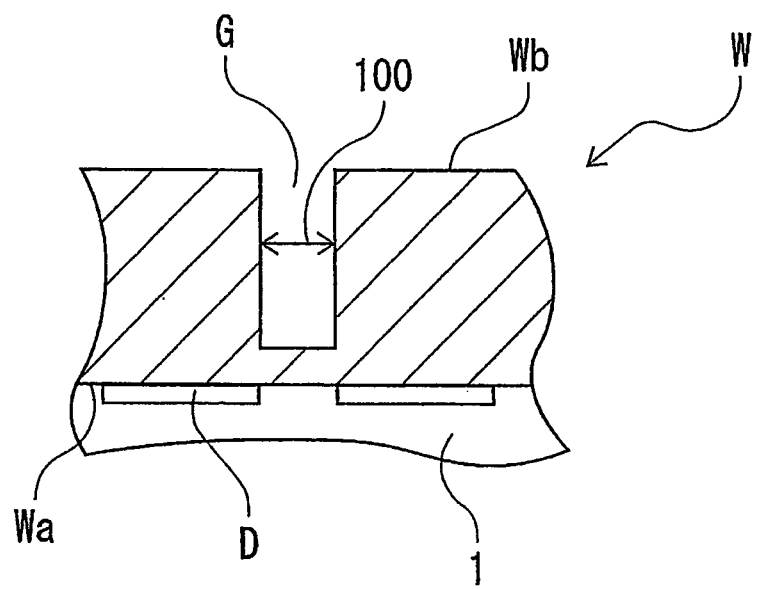
FIG. 3B is a partial enlarged sectional view of a wafer in the state in which a cut groove has been formed.

While the holding table 2 that holds the wafer W is moved in the X-axis direction, for example, the cutting means 10 lowers the cutting blade 13 in such a direction as to come closer to the wafer W while rotating the cutting blade 13 in a direction of arrow A, for example, at a predetermined rotation speed by rotating the spindle 11 around the axial center along the Y-axis direction. The cutting blade 13 is made to cut into the wafer W from the back surface Wb of the wafer W along the street S shown in FIG. 1 corresponding to one row oriented along the X-axis direction, and cutting is carried out. Therefore, as shown in FIG. 3B, a cut groove G having a groove width 100 is formed. The groove width 100 is set to 10 to 30 μm, for example. Furthermore, the depth of the cut groove G is set to a depth corresponding to a desired finished thickness.

After the cut groove G is formed along the street S corresponding to one row oriented along the X-axis direction, the above-described cutting is repeatedly carried out for all streets S oriented along the X-axis direction with indexing feed of the cutting means 10 shown in FIG. 3A in the Y-axis direction, so that the cut grooves G are formed. Thereafter, the wafer W is rotated by 90° through the rotation of the holding table 2 and the streets S oriented along the Y-axis direction before the rotation are oriented along the X-axis direction. Then, cutting similar to the above is repeatedly carried out to form the cut grooves G along all streets S.

(4) Wafer Dividing Step

Figure 4A:
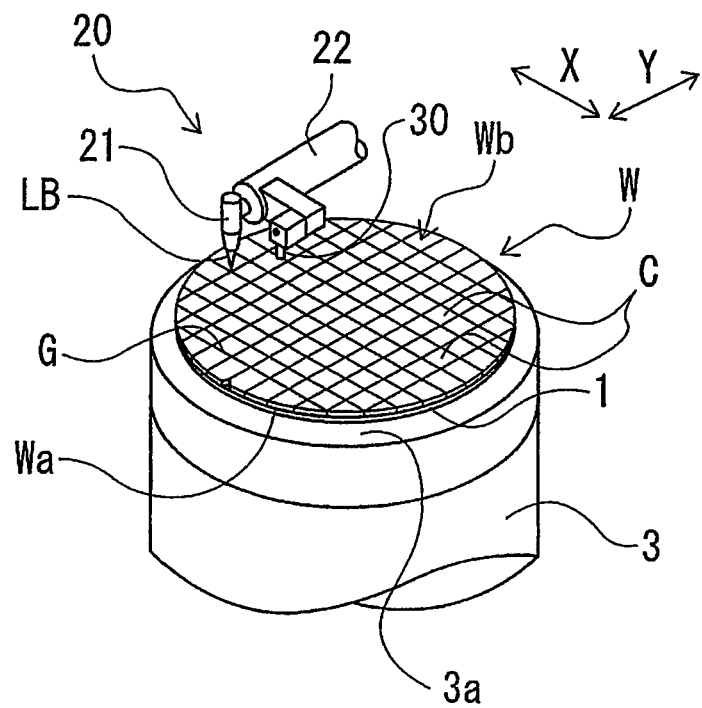
FIG. 4A is a perspective view showing a wafer dividing step.

After the cut groove forming step is carried out, as shown in FIG. 4A, the workpiece is held and is conveyed to a holding table 3 that can rotate. Thereafter, laser processing (ablation processing) is carried out by using laser beam irradiation means 20 disposed on the upper side of the holding table 3 and the wafer W is divided into individual chips C. The upper surface of the holding table 3 serves as a holding surface 3a that receives suction action from a suction source, which is not shown in the diagram, and holds the wafer W by suction. To the lower side of the holding table 3, movement means that relatively moves the holding table 3 and the laser beam irradiation means 20 in horizontal directions (X-axis direction and Y-axis direction) orthogonal to the vertical direction is connected.

The laser beam irradiation means 20 includes a laser processing head 21 that emits a laser beam LB with such a wavelength as to be absorbed by the wafer W in the direction perpendicular to the wafer W held by the holding table 3, and a casing 22 having a tip to which the laser processing head 21 is attached. An oscillator that oscillates the laser beam LB and an output power adjuster that adjusts the output power of the laser beam LB are housed inside the casing 22. A collecting lens for collecting the laser beam LB oscillated from the oscillator is incorporated inside the laser processing head 21. The laser beam irradiation means 20 includes a focal point position adjustment unit (not shown) for adjusting the position of the focal point of the laser beam LB collected by the collecting lens.

Imaging means 30 is disposed on a lateral side of the casing 22. The imaging means 30 is a camera in which a charge-coupled device (CCD) image sensor or a complementary metal oxide semiconductor (CMOS) image sensor is incorporated, for example. The imaging means 30 can detect the position at which the wafer W should be irradiated with the laser beam LB (cut groove G formed along the street S) by imaging the wafer W held by the holding table 3 from above and executing image processing of pattern matching and so forth.

When the ablation processing is carried out for the wafer W, the side of the front surface protective member 1 adhered to the front surface Wa of the wafer W is held by suction by the holding surface 3a and the back surface Wb of the wafer W is exposed upward. Subsequently, the holding table 3 is positioned below the imaging means 30. Then, the wafer W is imaged by the imaging means 30 and image processing of pattern matching and so forth is executed to carry out alignment to detect the cut groove G that should be irradiated with the laser beam LB.

Next, position adjustment between the laser processing head 21 and the detected cut groove G is carried out. This position adjustment is carried out by carrying out indexing feed of the holding table 3 in the Y-axis direction by the movement means or is carried out by carrying out indexing feed of the laser beam irradiation means 20 in the Y-axis direction. The laser beam irradiation means 20 adjusts the focal point of the laser beam LB to the height position of the back surface Wb of the wafer W. The laser beam irradiation means 20 adjusts the focal point of the laser beam LB to the height position of the back surface Wb of the wafer W. The output power of the laser beam LB is adjusted to output power at such a degree that the front surface protective member 1 does not melt and is set in the output power adjuster.

Figure 4B:
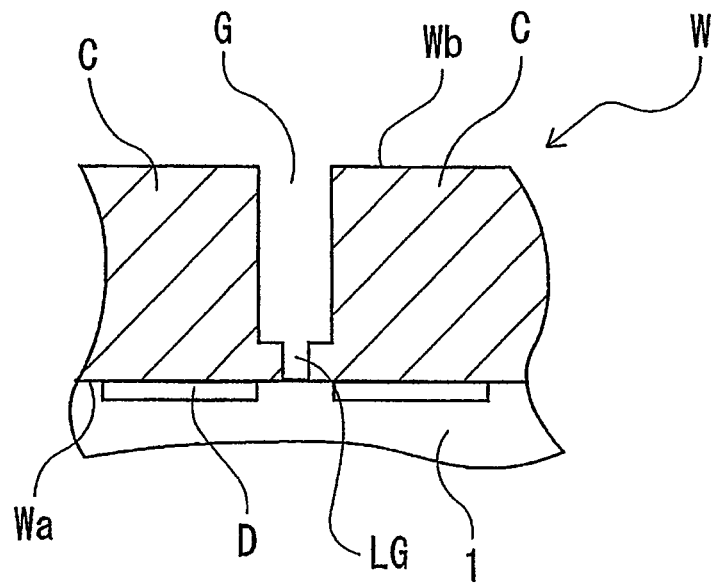
FIG. 4B is a partial enlarged sectional view showing the state in which the wafer has been singulated into individual chips.

Subsequently, while the laser processing head 21 and the wafer W are relatively moved in a direction parallel to the wafer W by moving the holding table 3 in the X-axis direction, for example, the laser beam LB having such a wavelength as to be absorbed by the wafer W is emitted from the laser processing head 21 along the cut groove G. Therefore, as shown in FIG. 4B, a laser-processed groove LG is formed just under the cut groove G. It suffices for the laser-processed groove LG to be at such a degree that the front surface protective member 1 appears and be a groove that fully cuts the front and back surfaces of the wafer W. The number of times of irradiation with the laser beam LB is not particularly limited and the laser-processed groove LG may be formed by irradiating the wafer W with the laser beam LB along the cut groove G plural times in a divided manner.

After the laser-processed groove LG is formed along the cut groove G corresponding to one row oriented along the X-axis direction, for example, indexing feed of the holding table 3 is carried out in the Y-axis direction and the laser processing head 21 is positioned on the upper side of an adjacent cut groove G. Then, similarly to the above, the laser-processed groove LG is formed by emitting the laser beam LB from the laser processing head 21 along the cut groove G while moving the holding table 3 in the X-axis direction, for example. By forming the laser-processed grooves LG along all cut grooves G in this manner, the wafer W is divided into the individual chips C. In the wafer dividing step shown in the present embodiment, the wafer W is divided into the individual chips C by the ablation processing. However, a laser beam having such a wavelength as to be transmitted through the wafer W may be emitted to form a modified layer inside the wafer W, and the wafer W may be divided into the individual chips C by employing this modified layer as the point of origin.

(5) Die Bonding Layer Disposing Step

Figure 5A:
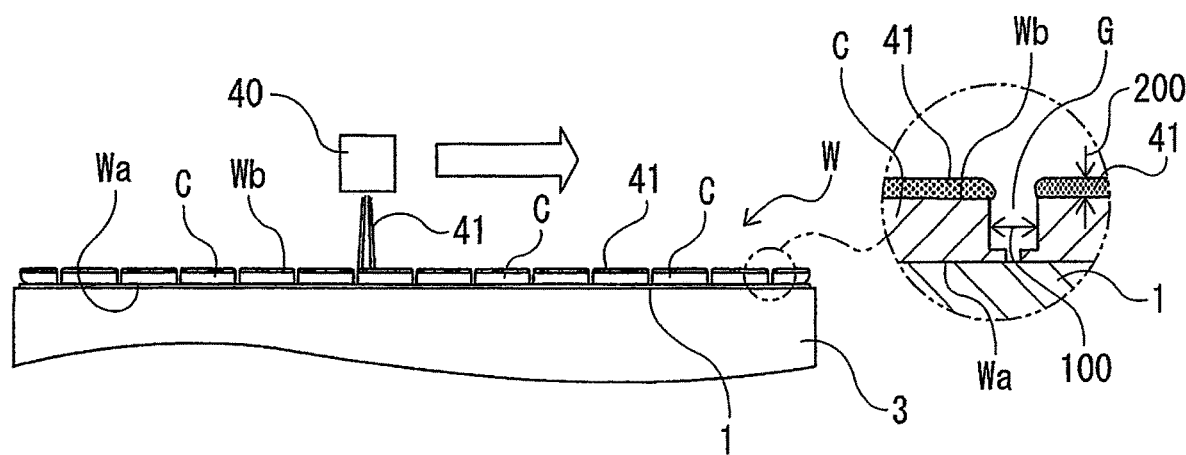
FIG. 5A and FIG. 5B are sectional views showing a die bonding layer disposing step.

Before or after the wafer dividing step is carried out, as shown in FIG. 5A, a liquid die bonding agent 41 is applied on the back surface Wb of the wafer W by using liquid agent supply means 40 that can move in the horizontal direction. The liquid agent supply means 40 is formed of a spray nozzle, for example, and a spray port to spray the liquid die bonding agent 41 downward is formed at the lower part thereof. The liquid die bonding agent 41 is composed of a polyimide-based resin, an epoxy-based resin, an acrylic-based resin, or the like, for example. It is desirable to use, as the liquid die bonding agent 41, an ultraviolet curable resin that is cured through irradiation with ultraviolet or a heat curable resin that is cured through heating.

While the liquid agent supply means 40 moves in the horizontal direction relative to the holding table 3, the liquid die bonding agent 41 is supplied from the liquid agent supply means 40 toward the back surface Wb of the wafer W, so that the liquid die bonding agent 41 is spread over the whole of the back surface Wb of the wafer W. The application of the liquid die bonding agent 41 is not limited to the case of the above-described spray coating and may be carried out by spin coating, screen printing, or the like, for example. In the case of applying the liquid die bonding agent 41 on the back surface Wb by spin coating, a predetermined amount of liquid die bonding agent 41 is supplied toward the back surface Wb of the wafer W while the holding table 3 is rotated at low speed to apply the liquid die bonding agent 41 on the whole of the back surface Wb of the wafer W.

Here, as shown in a partial enlarged view of FIG. 5A, an application thickness 200 of the liquid die bonding agent 41 applied on the back surface Wb of the wafer W is set to 5 to 25 µm, for example. It is preferable to adjust the application thickness 200 in such a manner that the application thickness 200 becomes a thickness smaller than the groove width 100 of the cut groove G. If the groove width 100 is set to 10 µm, for example, the application thickness 200 is set to 5 µm, for example. Furthermore, the viscosity and supply amount of the liquid die bonding agent 41 are also adjusted. By adjusting the application thickness 200 of the liquid die bonding agent 41 in this manner, the liquid die bonding agent 41 can be prevented from dripping down into the cut groove G between adjacent chips C. In addition, the liquid die bonding agent 41 can be applied to such an extent that the corners of the chips C are covered.

Figure 5B:
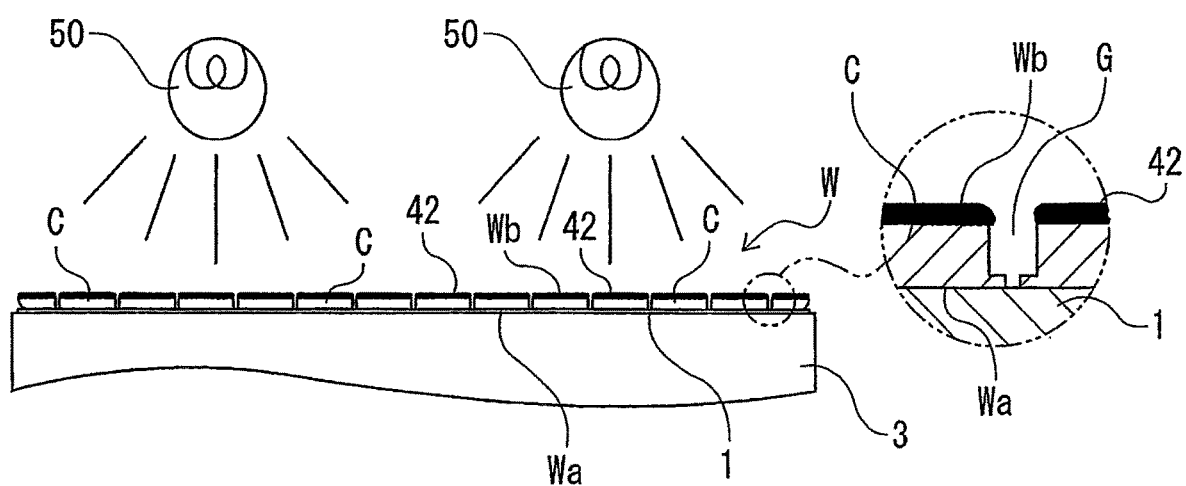

If the liquid die bonding agent 41 is an ultraviolet curable resin, as shown in FIG. 5B, for example, ultraviolet is radiated toward the back surface Wb of the wafer W by ultraviolet (UV) lamps 50 disposed on the upper side of the wafer W and the liquid die bonding agent 41 is cured by external stimulus due to the ultraviolet to form the chips C on which die bonding layers 42 are disposed on the back surface Wb. Due to this, as shown in a partial enlarged view of FIG. 5B, the die bonding layers 42 are formed at such a degree that the corners of the chips C are covered without filling of the cut groove G with the liquid die bonding agent 41. Thus, the flexural strength of the chips C can be enhanced. Furthermore, it is possible to prevent the risk that the die bonding layers 42 join to each other between adjacent chips C. If the liquid die bonding agent 41 is a heat curable resin, for example, the liquid die bonding agent 41 is cured by being heated by a heater or the like and the chips C on which the die bonding layers 42 are disposed on the back surface Wb are formed.

The above-described die bonding layer disposing step is explained as a step carried out after the wafer dividing step is carried out. However, in the case of carrying out the die bonding layer disposing step before the wafer dividing step is carried out, after at least the cut groove forming step is carried out to form the cut grooves G along the streets S, the liquid die bonding agent 41 is applied on the back surface Wb of the wafer W and is cured by being irradiated with ultraviolet or being heated to form the chips C on which the die bonding layers 42 are disposed on the back surface Wb. In the case of carrying out the die bonding layer disposing step after the cut groove forming step is carried out, it is preferable to apply a small amount of liquid die bonding agent 41 on the back surface Wb of the wafer W by spray coating plural times in a divided manner and cure the liquid die bonding agent 41 in order to keep the liquid die bonding agent 41 from entering the cut groove G. That is, it is preferable to repeatedly carry out the following process. Specifically, after the small amount of liquid die bonding agent 41 is applied on the back surface Wb of the wafer W, the liquid die bonding agent 41 is cured by being irradiated with ultraviolet or being heated. Thereafter, the small amount of liquid die bonding agent 41 is applied on the back surface Wb again and the liquid die bonding agent 41 is cured by being irradiated with ultraviolet or being heated.

As above, the processing method of a wafer according to the present invention includes the front surface protective member disposing step of disposing the front surface protective member 1 on the front surface Wa of the wafer W, the holding step of holding the side of the front surface Wa of the wafer W on which the front surface protective member 1 is disposed by the holding table 2, and the cut groove forming step of carrying out cutting with the cutting blade 13 along the streets S from the back surface Wb of the wafer W held by the holding table 2 to form the cut grooves G. The processing method of a wafer also includes the wafer dividing step of irradiating the wafer W with the laser beam LB with such a wavelength as to be absorbed by the wafer W along the cut grooves G and dividing the wafer W into the individual chips C after the cut groove forming step is carried out, and the die bonding layer disposing step of applying the liquid die bonding agent 41 on the back surface Wb of the wafer W and curing the liquid die bonding agent 41 applied on the back surface Wb of the wafer W to form the chips C on which the die bonding layers 42 are formed on the back surface Wb before or after the wafer dividing step is carried out. Therefore, even if the chip size of the singulated chips C is as small as 5 mm square or smaller, for example, the occurrence of die shift can be prevented and the die bonding layers 42 can be easily disposed on the back surface Wb. Therefore, the wafer W can be favorably divided into the individual chips C without taking a long processing time. Furthermore, according to the present invention, the liquid die bonding agent 41 is applied on the back surface Wb and the die bonding layers 42 are disposed at least after the cut grooves G are formed in the wafer W. Thus, the die bonding layer 42 is not cut by the cutting blade 13 and it is possible to prevent the occurrence of processing failure such as the occurrence of clogging in the cutting blade 13 and generation of a burr or the like in the die bonding layer 42.

In the case of dividing a wafer in the state in which the front surface of the wafer is oriented upward (state in which a tape is adhered to the back surface side), transfer is necessary to form the die bonding layer on the back surface. However, in the present invention, it becomes possible to divide the wafer W and form the die bonding layers 42 in the state in which the back surface Wb of the wafer W is oriented upward and therefore the transfer becomes unnecessary.

The processing method of a wafer according to the present invention is so configured that the side of the front surface Wa of the wafer W is split by the laser beam LB after the cut grooves G are formed by the cutting blade 13 with the back surface Wb of the wafer W oriented upward. Therefore, the breakage risk of the wafer W can be suppressed and improvement in the throughput can be achieved. Normally, there is a limit on the depth of the laser-processed groove that can be formed by one time of laser beam irradiation. Therefore, the wafer W needs to be fully cut after being thinned in advance. Alternatively, the wafer W needs to be fully cut after the same street S is irradiated with the laser beam plural times. In the case of fully cutting the wafer W by one time of laser beam irradiation, the wafer W needs to be enormously thinned and handling of the wafer W is difficult. According to the present invention, it becomes possible to suppress the number of times of irradiation with the laser beam LB for each street S by cutting the side of the back surface Wb of the wafer W by the cutting blade 13 in advance.

In the case of fully cutting a wafer from the wafer back surface side by a cutting blade, cracks and chipping are greatly generated on the wafer front surface side. However, according to the present invention, the front and back surfaces of the wafer W are not cut by the cutting blade 13, and the cut grooves G along the streets S are formed on the side of the back surface Wb and then the side of the front surface Wa of the wafer W is cut by the laser beam LB along these cut grooves G. Thus, the generation of cracks and chipping can be prevented. In addition, if the wafer W has a low-k film (low dielectric constant insulator coat) on the front surface Wa, low-k film separation is also not caused because the low-k film is subjected to laser processing. As above, due to the processing of the side of the front surface Wa of the wafer W by the laser beam LB, street reduction, i.e. reducing the width of the street S that should be irradiated with the laser beam LB, is enabled and the number of chips C obtained from one wafer W can be increased.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A processing method of a wafer having a front surface on which a device is formed in each of regions marked out by a plurality of streets that intersect, the processing method comprising:
   a front surface protective member disposing step of disposing a front surface protective member on the front surface of the wafer;
   a holding step of holding a front surface side of the wafer on which the front surface protective member is disposed by a holding table;
   a cut groove forming step of carrying out cutting with a cutting blade along the streets from a back surface of the wafer held by the holding table to form cut grooves, whereby after the cut groove forming step, a portion of the wafer remains between a base of the cut groove and the front surface protective member;
   a wafer dividing step of irradiating the portion of the wafer remaining after the cut groove forming step with a laser beam with such a wavelength as to be absorbed by the wafer along the cut grooves and dividing the wafer into individual chips after the cut groove forming step is carried out; and
   a die bonding layer disposing step of applying a liquid die bonding agent on the back surface of the wafer and curing the liquid die bonding agent applied on the back surface of the wafer to form the chips on which die bonding layers are disposed on the back surface before or after the wafer dividing step is carried out, wherein the die bond layer disposing step is performed without covering the base of the cut groove with the liquid die bonding agent, and
   wherein the die bonding disposing step is performed before the wafer dividing step is carried out, but after the cut groove forming step is carried out.

2. The processing method according to claim 1, wherein the die bonding layer disposing step is performed in such a manner that the liquid die bonding agent is prevented from dripping down into the cut grooves formed during the cut groove forming step.

3. A processing method of a wafer having a front surface on which a device is formed in each of regions marked out by a plurality of streets that intersect, the processing method comprising:
   a front surface protective member disposing step of disposing a front surface protective member on the front surface of the wafer;
   a holding step of holding a front surface side of the wafer on which the front surface protective member is disposed by a holding table;
   a cut groove forming step of carrying out cutting with a cutting blade along the streets from a back surface of the wafer held by the holding table to form cut grooves;
   a wafer dividing step of irradiating the wafer with a laser beam with such a wavelength as to be absorbed by the wafer along the cut grooves and dividing the wafer into individual chips after the cut groove forming step is carried out; and
   a die bonding layer disposing step of applying a liquid die bonding agent on the back surface of the wafer and curing the liquid die bonding agent applied on the back surface of the wafer to form the chips on which die bonding layers are disposed on the back surface, wherein the die bonding layer disposing step is performed before the wafer dividing step is carried out, but after the cut groove forming step is carried out;

wherein the die bonding layer disposing step results in a die bonding layer associated with each of said chips, and further wherein said die bonding layers on adjacent chips are not joined to each other while being deposited upon the wafer during the die bonding layer disposing step.

4. The processing method according to claim 3, wherein:

after the cut groove forming step, a portion of the wafer remains between a base of the cut groove and the front surface protective member; and the wafer dividing step comprises irradiating the portion of the wafer remaining after the cut groove forming step with the laser beam.

* * * * *